US009071246B2

(12) United States Patent
Subramaniam et al.

(10) Patent No.: US 9,071,246 B2
(45) Date of Patent: Jun. 30, 2015

(54) MEMORY CONTROLLER FOR HETEROGENEOUS CONFIGURABLE INTEGRATED CIRCUITS

(75) Inventors: Suresh Subramaniam, Palo Alto, CA (US); Mukunda Krishnappa, Cupertino, CA (US); Pohrong R. Chu, Saratoga, CA (US); Jason Golbus, Campbell, CA (US); Dana L. How, Palo Alto, CA (US)

(73) Assignee: Agate Logic, Inc., Santa Clara, CA (US)

( * ) Notice: Subject to any disclaimer, the term of this patent is extended or adjusted under 35 U.S.C. 154(b) by 1842 days.

(21) Appl. No.: 11/855,740

(22) Filed: Sep. 14, 2007

(65) Prior Publication Data

US 2009/0072856 A1 Mar. 19, 2009

(51) Int. Cl.
  G11C 7/00 (2006.01)
  H03K 19/177 (2006.01)
  G06F 13/16 (2006.01)

(52) U.S. Cl.
  CPC .......... *H03K 19/177* (2013.01); *G06F 13/1668* (2013.01); *G11C 7/00* (2013.01); *Y02B 60/1228* (2013.01)

(58) Field of Classification Search
  None
  See application file for complete search history.

(56) References Cited

U.S. PATENT DOCUMENTS

| 6,204,687 | B1 * | 3/2001 | Schultz et al. ................. 326/40 |
| 6,470,485 | B1 * | 10/2002 | Cote et al. ....................... 324/613 |
| 6,831,481 | B1 * | 12/2004 | Nguyen et al. .................. 326/58 |
| 7,103,730 | B2 * | 9/2006 | Saxena et al. ................. 711/156 |
| 7,424,698 | B2 * | 9/2008 | Honary et al. ................. 716/103 |
| 7,557,605 | B2 * | 7/2009 | D'Souza et al. ................. 326/38 |
| 7,711,907 | B1 * | 5/2010 | Baxter et al. .................. 711/149 |
| 7,773,595 | B2 * | 8/2010 | Wing et al. .................... 370/389 |
| 7,889,530 | B2 * | 2/2011 | Yu et al. ........................ 365/49.1 |
| 7,894,275 | B2 * | 2/2011 | Choi et al. ............... 365/189.05 |
| 7,902,862 | B2 * | 3/2011 | How et al. ...................... 326/38 |
| 8,605,533 | B2 * | 12/2013 | Seo .............................. 365/226 |
| 2005/0077918 | A1 | 4/2005 | Teifel et al. ..................... 326/41 |
| 2005/0193357 | A1 * | 9/2005 | Honary et al. ................. 716/17 |

(Continued)

FOREIGN PATENT DOCUMENTS

| WO | 2006/003693 | * | 1/2006 | ............. G06F 12/02 |
| WO | WO 2006003693 A1 * | 1/2006 | ............. G06F 12/02 |

OTHER PUBLICATIONS

Rexford, "Shortest-Path Routing," Spring 2006, COS 461: Computer Networks Lecture slides, pp. 1-35.*

(Continued)

*Primary Examiner* — Vanthu Nguyen
*Assistant Examiner* — Khamdan Alrobaie
(74) *Attorney, Agent, or Firm* — James M. Wu; JW Law Group

(57) ABSTRACT

A system including a configurable memory controller, a memory interface, and a configurable high speed communications fabric comprising a plurality of interconnect stations arranged in an array and operable to implement a plurality of pipelined buses, where the configurable memory controller is operably coupled to the configurable high speed communications fabric using a first interconnect station of the plurality of interconnect stations, where the memory interface is operably coupled to the configurable high speed communications fabric using a second interconnect station of the plurality of interconnect stations, where the plurality of interconnect stations are configured to satisfy a timing requirement of the memory interface, and where the configurable memory controller, the memory interface, and the configurable high speed communications fabric are associated with a configurable integrated circuit.

19 Claims, 9 Drawing Sheets

(56) References Cited

U.S. PATENT DOCUMENTS

2009/0077279 A1* 3/2009 Golbus et al. .................. 710/61
2009/0228633 A1* 9/2009 Horishima et al. ........... 711/103

OTHER PUBLICATIONS

"MT48LC16M32S2 -4 Meg × 32 × 4 Banks," Jun. 2005, Micron Datasheet, pp. 1-6.*

Moriyama et al., "DDR SDRAM Controller Using Virtex-5 FPGA Devices," Jul. 14, 2006, XILINX Application Note, pp. 1-16.*

Cosoroaba et al., "Achieving Higher System Performance with the Virtex-5 Family of FPGAs," Jul. 7, 2006, XILINX White Paper, pp. 1-12.*

"What is a FPGA?" by XILINX, can be found at http://www.xilinx.com/fpga/.*

* cited by examiner

MEMORY CONTROLLER FOR HETEROGENEOUS CONFIGURABLE INTEGRATED CIRCUITS

CROSS-REFERENCE TO RELATED APPLICATIONS

The present application contains subject matter that may be related to the subject matter in U.S. application Ser. No. 11/901,182, issued as U.S. Pat. No. 7,902,862, entitled: "High-Bandwidth Interconnect Network for an Integrated Circuit", filed on Sep. 14, 2007, and assigned to the assignee of the present application.

The present application also contains subject matter that may be related to the subject matter in U.S. application Ser. No. 11/855,666, issued as U.S. Pat. No. 7,557,605, entitled: "Heterogeneous Configurable Integrated Circuit", filed on Sep. 14, 2007, and assigned to the assignee of the present invention.

The present application also contains subject matter that may be related to the subject matter in U.S. application Ser. No. 11/855,697, issued as U.S. Pat. No. 7,773,595, entitled: "System and Method for Parsing Frames", filed on Sep. 14, 2007, and assigned to the assignee of the present invention.

The present application also contains subject matter that may be related to the subject matter in U.S. application Ser. No. 11/855,721, issued as U.S. Pat. No. 7,889,530, entitled: "Reconfigurable Content-Addressable Memory", filed on Sep. 14, 2007, and assigned to the assignee of the present invention.

The present application also contains subject matter that may be related to the subject matter in U.S. application Ser. No. 11/855,761, issued as U.S. Pat. No. 8,049,531, entitled: "General Purpose Input/Output System and Method", filed on Sep. 14, 2007, and assigned to the assignee of the present invention.

All mentioned U.S. applications are hereby incorporated by reference.

BACKGROUND

Digital systems can be implemented using off-the-shelf integrated circuits. However, system designers can often reduce cost, increase performance, or add capabilities by employing in the system some integrated circuits whose logic functions can be customized. Two common kinds of customizable integrated circuits in digital systems are application-specific integrated circuits (ASICs) and field-programmable gate arrays (FPGAs).

ASICs are designed and manufactured for a particular application. An ASIC includes circuits selected from a library of small logic cells. A typical ASIC also includes large special-purpose blocks that implement widely-used functions, such as a multi-kilobit random-access memory (RAM) or a microprocessor. The logic cells and special-function blocks must be placed at suitable locations on the ASIC and connected by means of wiring.

Application-specific integrated circuits (ASICs) have several advantages. As an ASIC contains only the circuits required for the application, it has a small die size. An ASIC also has low power consumption and high performance. However, ASICs have some disadvantages. It takes a lot of time and money to design ASICs because the design process is complex. Creating prototypes for an ASIC is complex as well, so prototyping also takes a lot of time and money.

Field-programmable gate arrays (FPGAs) are another kind of customizable integrated circuit that is common in digital systems. An FPGA is general-purpose device. It is meant to be configured for a particular application by the system designer.

Field-programmable gate arrays (FPGAs) have advantages over application-specific integrated circuits (ASICs). Prototyping an FPGA is a relatively fast and inexpensive process. Also, it takes less time and money to implement a design in an FPGA than to design an ASIC because the FPGA design process has fewer steps.

FPGAs have some disadvantages, the most important being die area. Logic blocks require more area than the equivalent ASIC logic cells, and the switches and configuration memory bits in routing crossbars (XBARs) require far more area than the equivalent wiring of an ASIC. FPGAs also have higher power consumption and lower performance than ASICs.

SUMMARY

In general, in one aspect, the invention related to a system. The system including a configurable memory controller, a memory interface, and a configurable high speed communications fabric comprising a plurality of interconnect stations arranged in an array and operable to implement a plurality of pipelined buses, where the configurable memory controller is operably coupled to the configurable high speed communications fabric using a first interconnect station of the plurality of interconnect stations, where the memory interface is operably coupled to the configurable high speed communications fabric using a second interconnect station of the plurality of interconnect stations, where the plurality of interconnect stations are configured to satisfy a timing requirement of the memory interface, and where the configurable memory controller, the memory interface, and the configurable high speed communications fabric are associated with a configurable integrated circuit.

In general in one aspect, the invention relates to a method for implementing a design using a configurable integrated circuit including a programmable logic block (PLB), a configurable memory controller, and a plurality of interconnect stations. The method including mapping the design to use the PLB and the configurable memory controller, identifying a plurality of signal nodes associated with at least one selected from the group consisting of the PLB and the configurable memory controller, and configuring the plurality of interconnect stations to connect the plurality of signal nodes, wherein configuring the plurality of interconnect stations comprises bypassing a pipeline register of at least one of the plurality of interconnect stations.

In general, in one aspect, the invention relates to a computer readable medium storing instructions for implementing a design using a configurable integrated circuit including a programmable logic block (PLB), a reconfigurable memory controller, and a plurality of interconnect stations. The instructions including functionality to map the design to use the PLB and the configurable memory controller; identify a plurality of signal nodes associated with at least one selected from the group consisting of the PLB and the configurable memory controller; and configure the plurality of interconnect stations to connect the plurality of signal nodes, where configuring the plurality of interconnect stations comprises bypassing a pipeline register of at least one of the plurality of interconnect stations.

Other aspects of the invention will be apparent from the following description and the appended claims.

DETAILED DESCRIPTION

Figure 1:
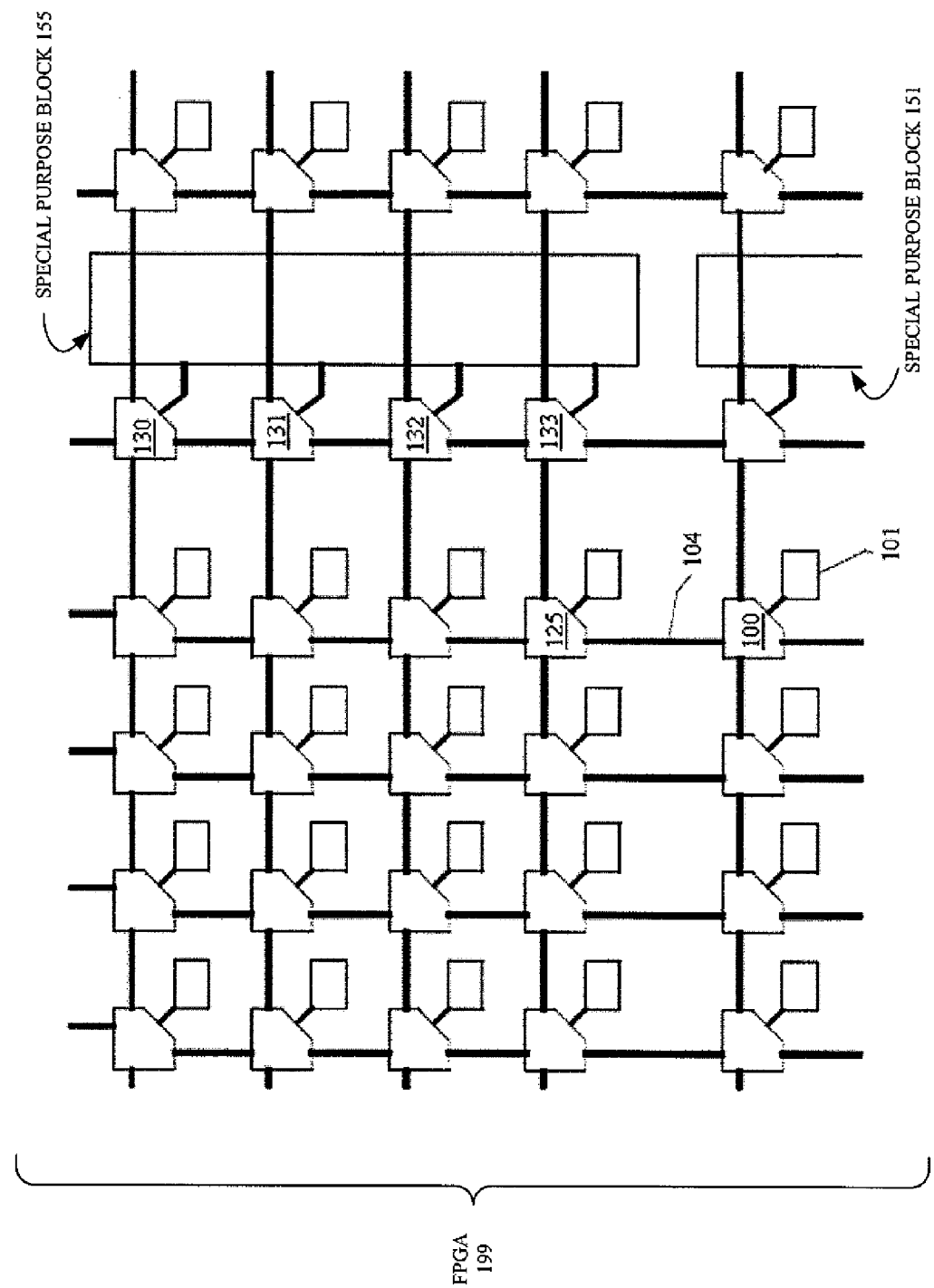
FIG. 1 shows an FPGA in accordance with one or more embodiments of the invention.

An example of the invention will now be described in detail with reference to the accompanying figures. Like elements in the various figures are denoted by like reference numerals for consistency. Further, the use of "ST" in the drawings is equivalent to the use of "Step" in the detailed description below.

In examples of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, in one aspect, the invention relates to a memory controller for a heterogeneous configurable integrated circuit and the associated design method. In one or more embodiments of the invention, the memory controller is connected to PLBs and other special-purpose blocks in a an FPGA using pipelined buses forming a reconfigurable high speed communications fabric. This communications fabric improves the operating speed and narrows the performance gap between the FPGA and an ASIC. The high speed communications fabric, however, introduces interconnection latency due to the inherent nature of the pipelined buses. Certain circuit configurations are required to accommodate the latency for proper operation of the FPGA. For example, in the memory controller and a special-purpose block performing general purpose input/output (GPIO) functions, circuit configurations are devised to accommodate the latency and take advantage of the high speed communications fabric for connecting PLBs, the memory controller, and the GPIO block in the FPGA.

FIG. 1 shows an FPGA (199) in accordance with one or more embodiments of the invention. As shown in FIG. 1, the FPGA (199) includes one or more programmable logic blocks (101), one or more configurable special-purpose blocks (151, 155), and one or more routing crossbars (XBARs) (100, 125, 130, 131, 132, 133). Each programmable logic block (101) may include one or more 4-input lookup tables (LUTs) (not shown) and one or more configurable 1-bit sequential cells (not shown). A configurable special-purpose block (151, 155) implements a widely-used function. Those skilled in the art, having the benefit of this detailed description, will appreciate the FPGA (199) may have more than one type of special-purpose block (151, 155).

As also shown in FIG. 1, the routing crossbars (XBARs) (100, 125, 130, 131, 132, 133) form a two-dimensional routing network that provides configurable connections among the logic blocks (101) and the special-purpose blocks (151, 155). Each XBAR may be connected to the nearest-neighbor XBARs in four directions and to either a logic block or a special-purpose block. For example, routing crossbar (125) and routing crossbar (100) are connected by buses (104). Although both logic blocks and special-purpose blocks connect to XBARS, special-purpose blocks are typically much larger than logic blocks and typically have more input and output signals. Accordingly, a special-purpose block may be connected by a plurality of buses to a plurality of XBARs (e.g., special-purpose block (151) is connected to XBARs (130, 131, 132, 133)).

The logic blocks (101), special-purpose blocks (151, 155), and routing crossbars (100, 125, 130, 131, 132, 133) may contain configuration memory bits. A user's design is implemented in the FPGA by setting the configuration memory bits appropriately. Several forms of configuration memory are used by contemporary FPGAs, the most common form being static random-access memory (SRAM).

Figure 2:
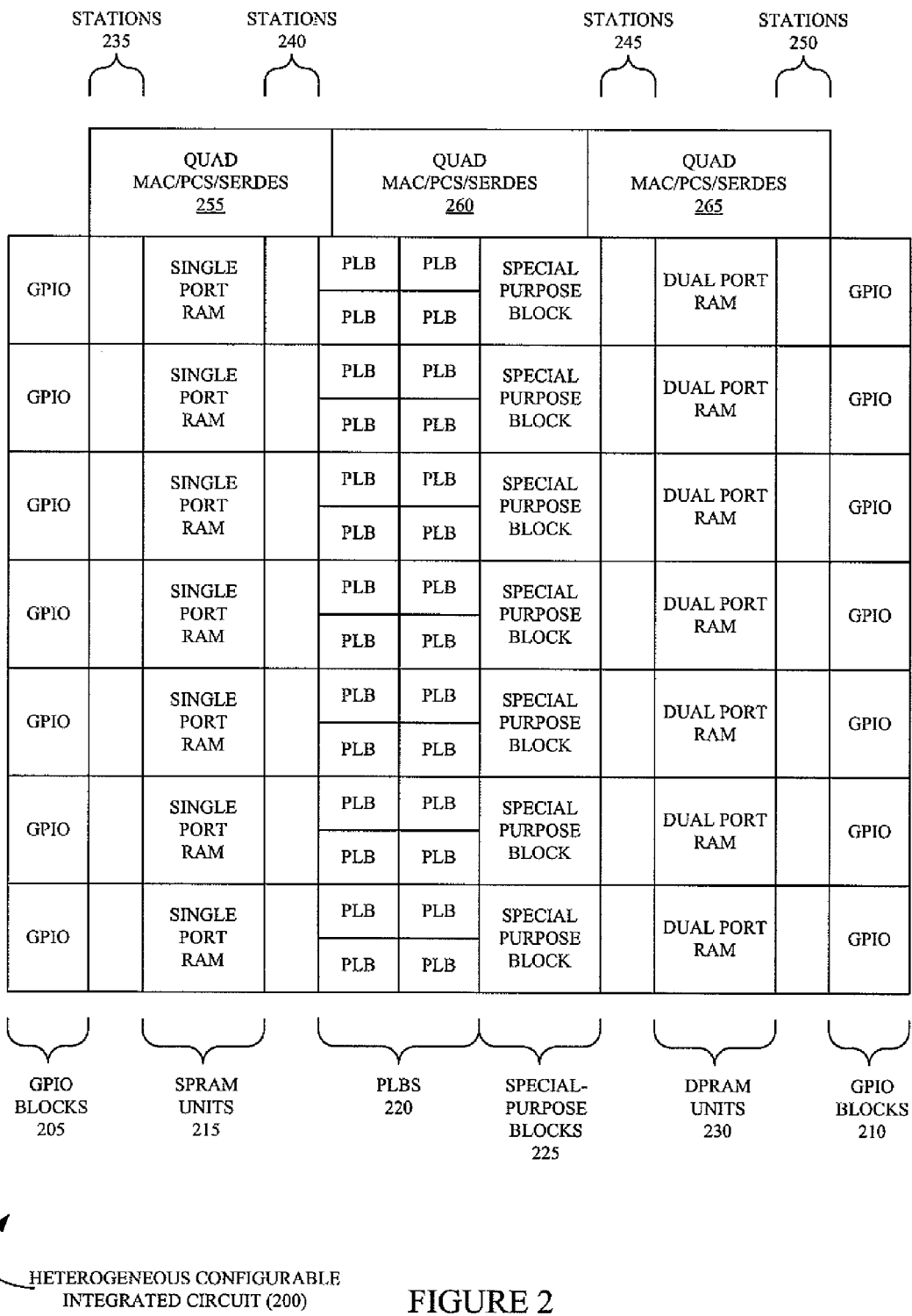
FIG. 2 shows a heterogeneous configurable integrated circuit in accordance with one or more embodiments of the invention.

FIG. 2 shows part of a heterogeneous configurable integrated circuit (HCIC) (200) in accordance with one or more embodiments of the invention. As shown in FIG. 2, the HCIC (200) has numerous components including one or more columns of GPIO blocks (205, 210), at least one column of single port ram units (SPRAM) (215), multiple columns of PLBs (220), at least one column of special-purpose blocks (225), at least one column of dual port RAM units (DPRAM) (230), multiple columns of stations (235, 240, 245, 250), and multiple quad MAC/PCS/SERDES units (255, 260, 265) bordering the HCIC (200). In one or more embodiments of the invention, the HCIC (200) is fabricated on a monolithic semiconductor substrate.

Although FIG. 2 only shows quad MAC/PCS/SERDES units (255, 260, 265) bordering one side of the HCIC (200), those skilled in the art, having the benefit of this detailed description, will appreciate other embodiments of the invention include quad MAC/PCS/SERDES units on multiple sides of the HCIC (200). Additionally, although FIG. 2 only shows a single column of SPRAM units (215), two columns of PLBs (220), and a single column of DPRAM units (230), those skilled in the art, having the benefit of this detailed description, will also appreciate the HCIC (220) may have any number of columns of the mentioned components.

In one or more embodiments of the invention, a special-purpose block (225) is a reconfigurable frame parser unit, a reconfigurable arithmetic unit (RAU), a reconfigurable content addressable memories (RCAM), a memory controller, etc. Although FIG. 2 only shows a single column of special-purpose blocks (225), those skilled in the art, having the benefit of this detailed description, will also appreciate other embodiments of the invention have multiple columns of special-purpose blocks, where each column contains a single type of special-purpose block (i.e., RCAM, RAU, etc.).

In one or more embodiments of the invention, the multiple stations (235, 240, 245, 250) form a data cross-connect (DCC) network. This DCC network is a two-dimensional grid of stations that spans the entire HCIC (200). In one or more embodiments of the invention, the DCC network is as described in U.S. application Ser. No. 11/901,182, issued as U.S. Pat. No. 7,902,862, entitled "High-Bandwidth Interconnect Network for an Integrated Circuit," which was previously incorporated by reference. In one or more embodiments of the invention, the HCIC (200) also includes a routing crossbar network (not shown) in a plane parallel to the DCC network.

Figure 3A:
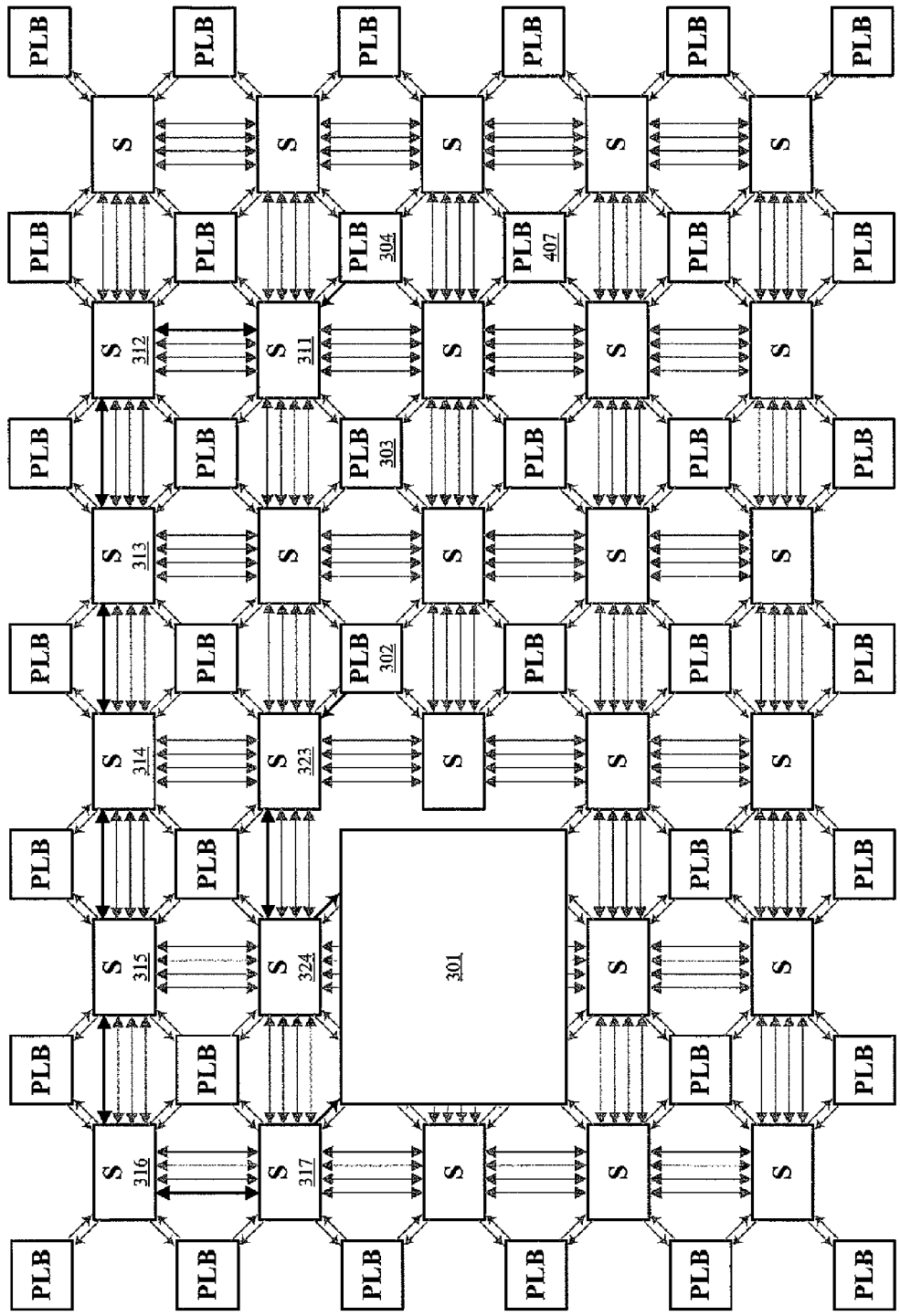
FIGS. 3A and 3B show an inter-mesh of interconnect stations and logic blocks in accordance with one or more embodiments of the invention.

FIG. 3A shows an inter-mesh of interconnect stations and logic blocks in accordance with an embodiment of the present invention. Here, an array of interconnect stations (denoted with an 'S' in FIG. 3A and FIG. 3B) are intermeshed with an array of PLBs (denoted as 'PLB' in FIG. 3A and FIG. 3B). The array of interconnect stations implements pipelined buses to form a high speed communications fabric. The array of PLBs forms a PLB fabric to perform general functions as needed. In addition to the PLBs, logic blocks also include special-purpose block to perform dedicated special functions. In one example, a special-purpose block may be implemented as a mask programmable block, or hard macro, (301) connecting to neighboring interconnect stations. In another example, the special-purpose block may be implemented using a collection of PLBs (302304) as a soft macro. The soft macro may be configured to perform the specific function of the special-purpose block by way of a netlist or a hardware description language such as Verilog, VHDL, or the like. In one example, each interconnect station includes bus connections to each neighboring PLBs, referred to herein as ports, and bus connections to each neighboring interconnect stations, referred to herein as ramps. In an example, for each direction, north, south, east, and west, there are four input ramps and four output ramps to other interconnect stations. Each ramp is five bits wide. On each interconnect station there are four input ports and four output ports. Each port connecting the interconnect station to the PLBs is five bits wide. The ports act as entry and exit to and from the high speed communications fabric. In some examples, the signal propagation delay between consecutive interconnect stations may be represented by T and the pipelined buses may be clocked up to the maximum frequency f=1/T. There may be slight time increase for delay through each of the pipeline register. However this increase may be small compared to T. The heterogeneous configurable integrated circuit using pipelined buses for connecting PLBs and special-purpose blocks may be as described in U.S. application Ser. No. 11/855,666 entitled "Heterogeneous Configurable Integrated Circuit," which was previously incorporated by reference.

Figure 3B:
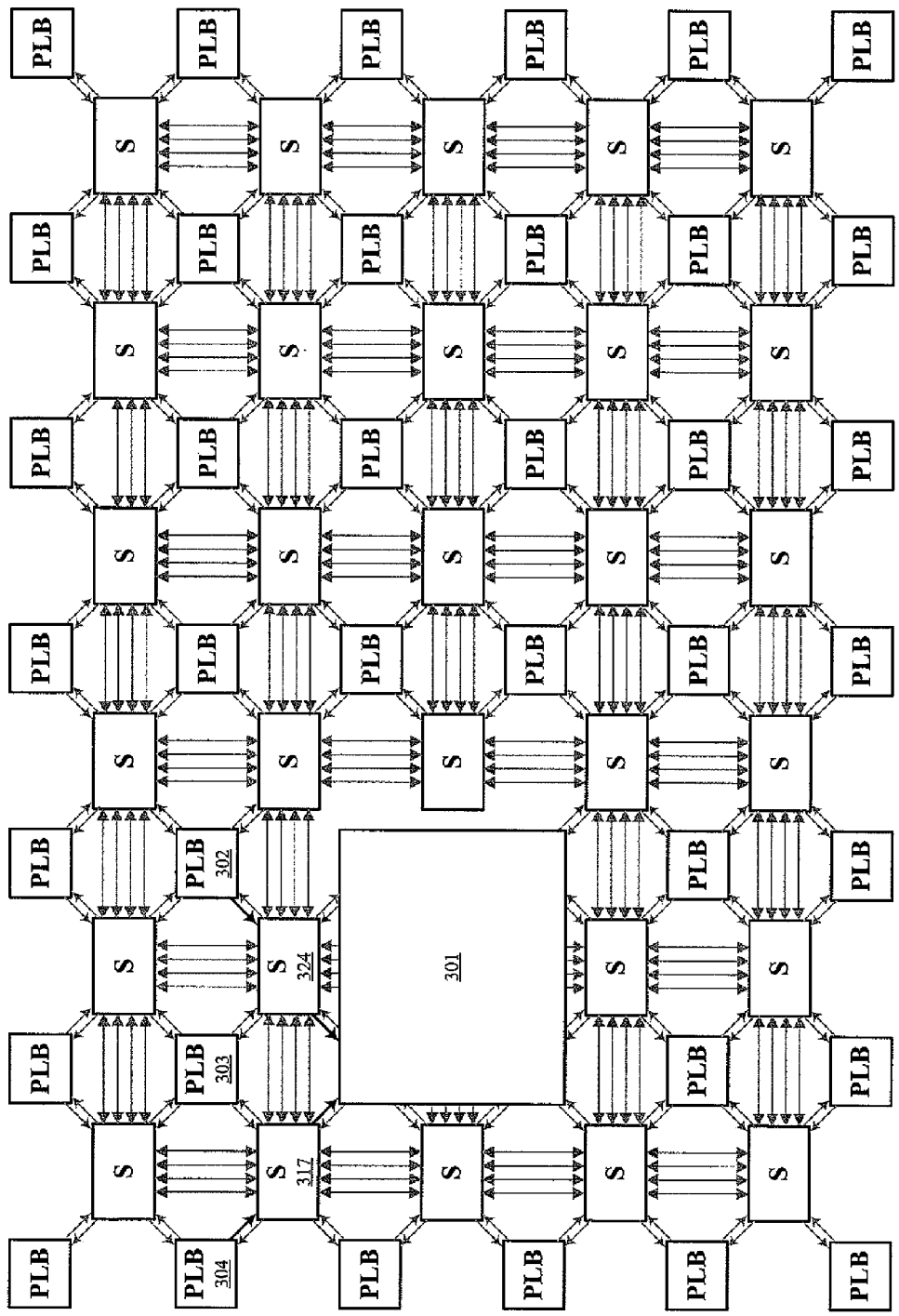

As discussed above, one or more of the special-purpose blocks (225) may be a memory-controller. In one example, the memory controller (499) is implemented as the hard macro (301). A first signal propagates along a first signal path (304, 311-317), and (301). A second signal propagates along a second signal path (302, 323, 324, and 301). The first and second signals may be address input signals generated from PLBs (302-304). In another example, the hard macro (301) may include a plurality of the GPIO blocks. The first and second signals may be data input signals generated from PLBs (302-304). In both examples, the PLBs (302-304) may be part of a soft macro. Based on the circuit operation, excessive propagation delays along the first and second signal paths may negatively impact the operation or performance of the memory controller or the plurality of the GPIO blocks. The negative impact may be reflected in reduced operating frequency or decreased data connection bandwidth. The interconnect stations along the first and second signal paths may act as pipelined sequential registers and allow the first and second signals to be clocked at increased frequency thus increasing the data connection bandwidth. However, interconnection latency may be introduced due to the inherent nature of the pipelined buses. The interconnection latency may vary depending on the distance a signal travels between the source and destination. In the above example, by using the pipelined connection, an interconnection latency of seven clock cycles may be introduced along the first signal path as the first signal traverses the pipeline registers of the interconnect stations (311-317). An interconnection latency of two clock cycles may be introduced along the second signal path as the second signal traverses the pipeline registers of the interconnect stations (323 and 324). This mismatch in interconnection latency may not be acceptable according to the circuit operation of the memory controller or the plurality of the GPIO blocks. One approach to eliminate this interconnection latency mismatch is shown in FIG. 3B. Here, the signal path (304, 317, 301) and signal path (302, 324, 301) are matched in interconnection latency by optimizing the physical placements of the memory controller, or the plurality of the GPIO blocks, and the designation of the PLBs. However, the strong placement constraint demanded by this approach may not be feasible in the case where multiple interconnection latency requirements may impose conflicting placement constraints. For an example, the memory controller, or the plurality of the GPIO blocks, may include 50 or more address or data input signals which may all require matched interconnection latency. One skilled in the art will recognize that it may not be feasible to satisfy the interconnect latency matching requirement from such large number of signal paths. A second approach is shown in FIG. 3A where the interconnect latency may be adjusted for each signal path according to the matching requirement. Here, interconnect stations (312) and (314) along the first signal path are configured as registered interconnect stations. The interconnect stations (313) and (315-317) are configured to have their pipeline registers bypassed. The interconnect latency along the first signal path may be matched to that of the second signal path in this manner. In this example, the resultant interconnect latency is two clock cycles limited by the second signal path which is the shorter of the two signal paths that require interconnect latency matching. The resultant maximum frequency that the first and second signal paths may be clocked is f/3 limited by the pipeline stages (315-317) of the first signal path with a total delay of 3T. In an example where circuit operation requires to match the interconnect latency for multiple signals along respective signal paths, the minimum number of clock cycles of the resultant interconnect latency may be determined according to the shortest signal path and the resultant maximum frequency that these multiple signal paths can be clocked may be determined according to the longest signal path. A benefit function may be formulated representing weighed impact on system performance from an estimate of the interconnection latency and an estimate of the clock frequency of the multiple signal paths. The benefit function may be used to drive the placement or routing algorithms for implementing a design using the memory controller, or the plurality of the GPIO blocks, in the heterogeneous configurable integrated circuit.

Although the many examples above are shown using the memory controller, or the plurality of the GPIO blocks, implemented as a hard macro, one skilled in the art will appreciate that the invention may be practiced where the memory controller, or the plurality of the GPIO blocks, is implemented as a soft macro and achieve similar advantageous results.

Figure 4:
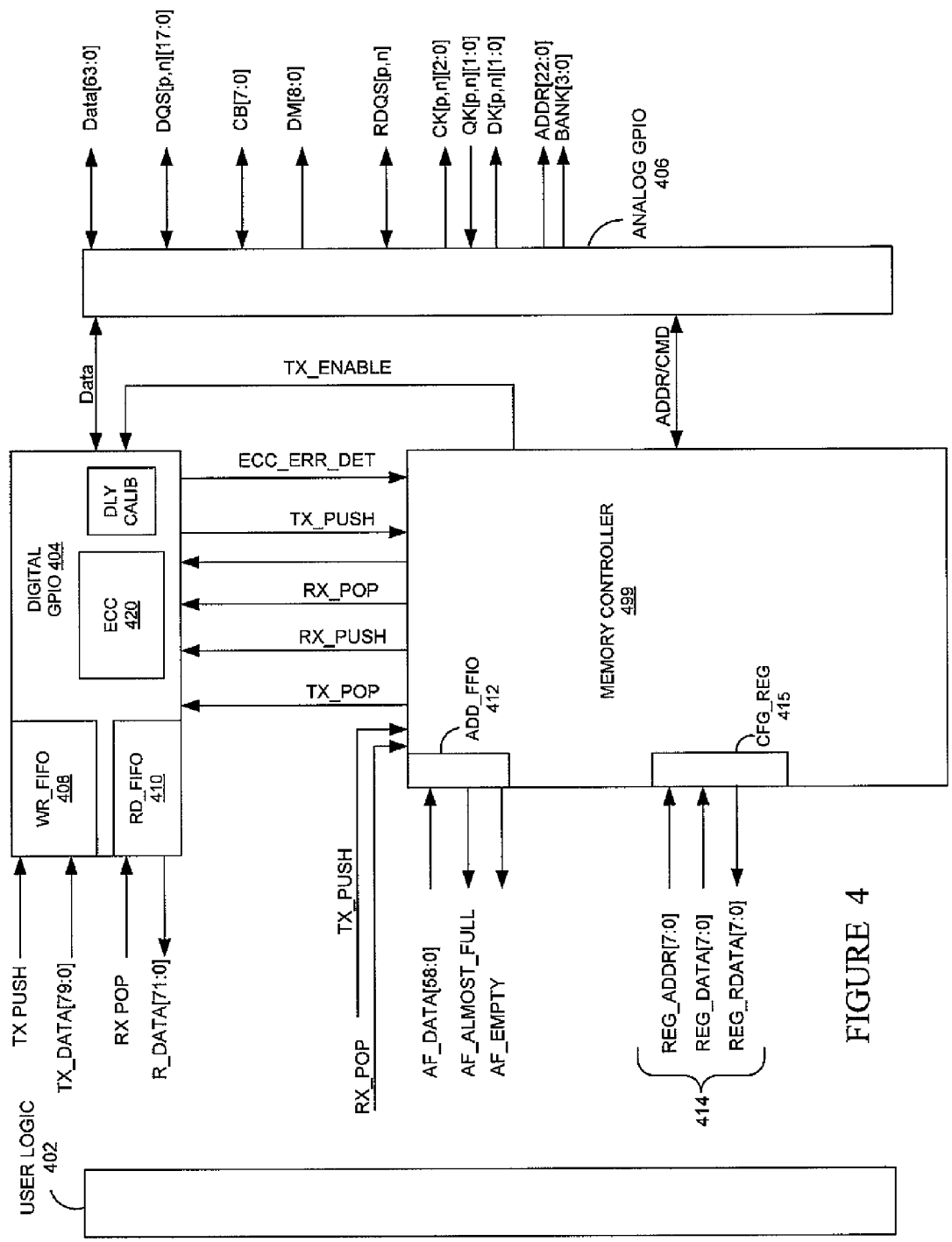
FIG. 4 shows a memory controller interfacing with a general purpose input/output (GPIO) and a user logic in accordance with one or more embodiments of the invention.

FIG. 4 shows the memory controller (499) interfacing a GPIO and a user logic in accordance with one or more embodiments of the invention. Here, user logic (402) exchanges signals (such as the mode register data bus (414), AF_DATA[58:0], START_INIT, INIT_DONE, BYPASS, SYS_CLK, etc) with the memory controller (499), the memory controller (499) exchanges signals (such as RX_PUSH, TX_POP, ADDR/CMD, etc.) with the GPIO, and the GPIO exchanges signals (such as TX_DATA[63:0], R_DATA[71:0], etc.) with the user logic (402). The GPIO includes the digital GPIO (404) and the analog GPIO (406). Three FIFOs, including the write FIFO (408), the read FIFO (410), and the address FIFO (412), may be provided for holding information related to the write, read, and address operations, respectively. Among the three FIFOs, the read FIFO (410) and the write FIFO (408) may be implemented in the digital GPIO (404), and the address FIFO (412) may be implemented in the memory controller (499) as shown in FIG. 4. The digital GPIO (404) and the analog GPIO (406) include multiple digital GPIO blocks and multiple analog GPIO blocks respectively (not shown). A digital GPIO block and an analog GPIO block forms a GPIO block (not shown) which includes circuits associated with one or two bit of data. Although the block diagram of FIG. 4 shows the digital GPIO (404) separate from the analog GPIO (406) without illustrating multiple GPIO blocks, in embodiments of the invention, each GPIO block may be implemented as a hard macro and multiple GPIO blocks may be disposed side by side to form the GPIO (212) along one or more edge of a monolithic semiconductor substrate as sown in FIG. 2B.

The memory controller (499) may be used to schedule read and write transactions with an array of external memory devices (not shown). The external memory devices may be of different flavors of synchronous dynamic random access memory (SDRAM) such as double data rate (DDR), DDR2, DDR3, quad data rate (QDR), QDR II, and QDR II+ SDRAMs, as well as reduced latency DRAM (RLDRAM), and RLDRAM II.

These read and write transactions may be tracked with an address FIFO (412). The memory controller (499) may also be used for initialization, for providing a debugging bypass mode and for other specialized user requirements. The mode register data bus (414) (such as REG_ADDR, REG_DATA, REG_RDATA, etc.) is used for setting values in the mode configuration registers (415). The configuration bits from the configuration registers (415) indicate to the memory controller (499) regarding the memory types, address, data width, and operating frequency. The delay calibration block (416) included in the digital GPIO block (404), in accordance with an embodiment of present invention, is used to determine the offset required to center data (such as DATA[63:0]) with respect to a strobe (such as DQS[p,n][17:0]) to meet circuit requirement, such as data sampling margins. The delay calibration block may also be used to compensate for jitter, board-induced skews, and other known variations that impact the relative signal timings such as process variation, voltage variation, and temperature variation.

In one or more embodiments of the invention, clocking data into and out of the external memory uses a clock that may be out of phase with a clock signal generated by the memory controller (as specified by configuration bits in configuration registers (415). These two clock domains may be referred to as mesochronous clocking domains. The clocking FIFOs provided at the memory controller interface are intended to provide clock alignment for the mesochronous clocking domains so that data can be written to or retrieved correctly from external memory.

A state machine (not shown) may be provided for sequencing commands and managing the timing relationships between the commands for the read and write transactions. The state machine is configurable based on the memory type settings in the configuration registers (415). The addresses, data, control, and clock signals (such as ADDR[22:0], DATA [63:0], DQS[p,n][17:0], RAS#, CAS#, WE#/W#, CKE[3:0], etc.) of the analog GPIO (406) constitute the physical interfaces to the external memory device (not shown). The ECC block (420), provided within the digital GPIO block (404) in this exemplary configuration, provides error detection and correction capabilities. Although FIG. 4 shows only one memory controller, more than one memory controllers may be instantiated, and wider buses can be accordingly implemented.

More details of the signals shown in FIG. 4 are listed in the following Table 1.

TABLE 1

Memory controller user interface signals.

| Signal | Description |
|---|---|
| USER → MEMORY CONTROLLER | |
| AF_DATA[58:0] | Address FIFO data containing information such as row address, column address, etc., (contains write address for QDR). See Section 4.3.1 for details |
| AF_VALID | Address valid signal |
| BYPASS | When this bit is set to 1, the memory controller just passes through all commands on the AF_DATA bus. |
| TX_PUSH | Signal from the user logic to indicate that data is being written into the write FIFO |
| RX_POP | Signal from the user logic to indicate that data is being pulled out of the Read FIFO |
| RESET | Global reset for the controller |
| START_INIT | Begin memory initialization |
| REG_ADDR[7:0] | Address bits for memory controller registers |
| REG_WDATA[7:0] | Write Data bits for memory controller registers |
| REG_RDATA[7:0] | Read Data bits for memory controller registers |
| REG_WE | Read/Write bit for the register interface. If set to 0, data from the address specified on REG_ADDR is available on the REG_RDATA bus to the user. When set to 1, user data on the REG_WDATA bus is written into the register specified by REG_ADDR |

TABLE 1-continued

Memory controller user interface signals.

| Signal | Description |
| --- | --- |
| REFRESH | Signal from the user to instruct the memory controller to issue a refresh on demand |
| AUTO_REFRESH (Register bit) | When this bit is set to 1, the memory controller will issue refreshes to the external memory device automatically |
| POWER_DOWN (Register Bit) | When this bit is set to 1, the memory controller will manage power, in a limited way, on the external memory device automatically |
| PRECHARGE | When this bit is set to 0, the memory controller keeps the bank and row open for subsequent accesses even if the FIFO is empty or it is the last transaction. When set to 1, it automatically issues a precharge if the FIFO is empty or after the last transaction |
| LD_MODE | When set to 1 the controller loads the mode register settings into the external memory device |
| MEMORY CONTROLLER → USER | |
| AF_ALMOST_FULL | Address FIFO status flag indicating that there is room for one more address |
| AF_EMPTY | Address FIFO empty status |
| AF_FULL | Address FIFO full status flag |
| TX_FIFO_EMPTY | Write FIFO empty status to user |
| TX_FIFO_FULL | Write FIFO full status flag to user |
| TX_FIFO_ALMOST_EMPTY | Write FIFO status flag to user indicating that no writes will not proceed unless user pushes more data |
| RX_FIFO_EMPTY | Write FIFO empty status user |
| RX_FIFO_FULL | Write FIFO full status flag to user |
| RX_FIFO_ALMOST_FULL | Read FIFO status flag to user indicating that reads will not proceed unless the user pops out more data |
| INIT_DONE | Status flag indicating controller initiated memory initialization is complete |
| ECC_ERR_DET | Status bit indicating that an ECC error was detected |
| ECC_ERR_CORR | Status bit indicating that an ECC error was corrected |
| MRS_DONE | Status flag indicating controller has completed loading the MRS settings into the external memory |
| MEMORY CONTROLLER → GPIOs | |
| RX_POP | Signal from the user to pop data from the read FIFO onto the data bus |
| TX_PUSH | Signal from the user to push data from the data bus into the Write FIFO |
| TX_POP | Signal from the controller to pop data from the write FIFO onto the data bus |
| RX_PUSH | Signal from the controller to push data from the data bus into the Read FIFO |
| USER → GPIOs | |
| TX_DATA[63:0] | Write FIFO data. This data width supports 64-bit wide implementations. (64-data + 8 Data Mask + 8 Check Bits) |
| R_DATA[71:0] | Read FIFO data. This data width supports 64-bit wide implementations. (64-data + 8 Check Bits) |

| GPIO ←→ EXTERNAL MEMORIES | |
|---|---|
| DQ | Data bits [71:0] |
| DQS | Data Strobe [8:0][p,n] |
| DM | Data Mask bits [8:0] |
| CB | ECC Check Bits [7:0] |

| CLOCK FABRIC → GPIOs | |
|---|---|
| tx_clk | Transmit FIFO clock |
| rx_clk | Receive FIFO clock |
| Sclk | Memory Controller Clock |

| GPIOs → MEMORY CONTROLLER | |
|---|---|
| ECC_ERR_DET | Status bit indicating that an ECC error was detected |
| ECC_ERR_CORR | Status bit indicating that an ECC error was corrected |

It may be advantageous to decouple the data path functions (such as the read FIFO (410) and write FIFO (408)) from the memory controller (499). In some examples, the application of the heterogeneous configurable integrated circuit may not require a memory controller to be configured and the read FIFO (410) and write FIFO (408) may be configured to perform other functionalities separate from the memory controller.

Various flavors of SDRAM requires different number and order of address signals. It is necessary to map address signals (such as AF_DATA[55:0]) from the user logic (402) according to the specific number and order required by the external memory devices. This mapping may be performed from AF_DATA to Address FIFO (412). Examples of such bit mapping are shown in Table 5, where grey shaded boxes indicate unused bits for that memory configuration. In some examples, the memory controller will wrap addresses back to zero when the top of the memory is reached. The memory controller may be configured to automatically handle the variations in densities of the external memory device and the corresponding variations in boundaries of the row, column address, rank, and bank bits.

TABLE 5

AF_DATA/Address FIFO Bit Mapping

| | | | | | 0 9 8 7 6 5 4 3 2 1 0 | |
|---|---|---|---|---|---|---|
| LENGTH | Row Address | | RA | BA | Column Address | DDR3 |
| LENGTH | Row Address | | RA | BA | Column Address | DDR2 |
| LENGTH | Row Address | | RA | BA | Column Address | DDR |
| LENGTH | | | | | Address | QDR I/II SRAM |
| LENGTH | | | | | Address | DDR I/II SRAM |
| LENGTH | | CS | | BA | Address | RLDRAM I/II |

| 55-52 | 51 | 50 | 49-56 | 45 | 44-41 | |
|---|---|---|---|---|---|---|
| ODT[3:0] | RAS | CAS | CKE[3:0] | WE | CS[3:0] | DDR3 |
| ODT[3:0] | RAS | CAS | CKE[3:0] | WE | CS[3:0] | DDR2 |
| ODT[3:0] | RAS | CAS | CKE[3:0] | WE | CS[3:0] | DDR |
| ODT[3:0] | | | CKE[3:0] | WE | CS[3:0] | QDR I/II SRAM |
| ODT[3:0] | | | CKE[3:0] | WE | CS[3:0] | DDR I/II SRAM |
| ODT[3:0] | RAS | CAS | CKE[3:0] | WE | CS[3:0] | RLDRAM I/II |

In the BYPASS mode, bit 56, 57, 58 are mapped to RX_PUSH, TX_POP, and TX_DQS_ENABLE respectively.

Figure 5:
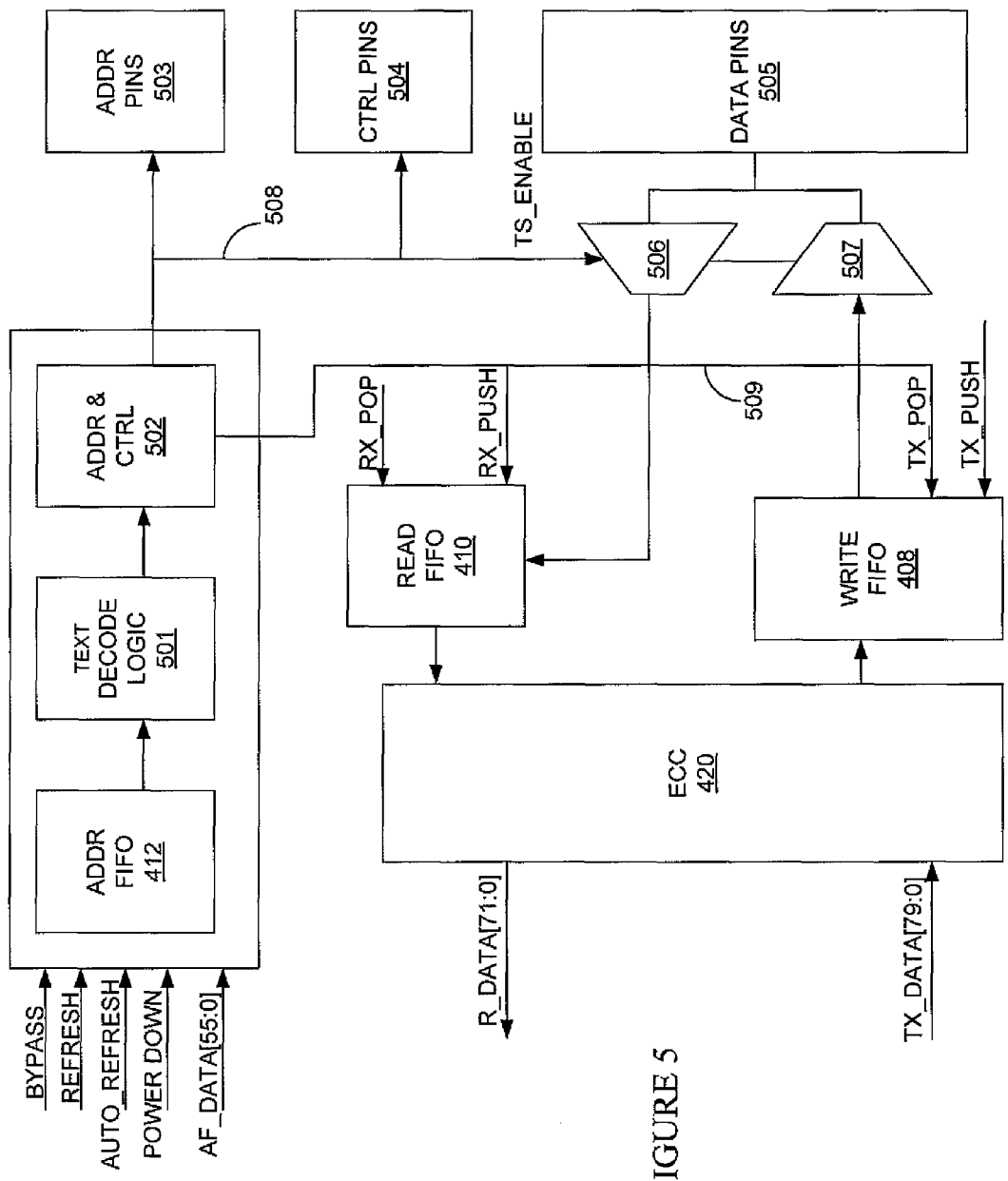
FIG. 5 shows an Address/Control path and Data path in accordance with one or more embodiments of the present invention.

FIG. 5 shows more details of FIG. 4 and shows the general flow of information in the address/control and data path. In the example here, address FIFO (412), decode logic (501), and address/control circuit (502) are implemented inside the memory controller (499). The read FIFO (410) and write FIFO (408) are implemented inside the GPIO. The address pins (503), control pins (504), and data pins (505) are physical interfaces with the external memory devices and are also implemented inside the GPIO. The tri-state signals (508) control signal directions of address pins (503), control pins (504), and data pins (505). It is known in the art that various flavors of SDRAM exhibit a "read latency" and a "write latency" where several clock cycles are required for data to be read from or written to the SDRAM after the address is presented. The read FIFO (410), write FIFO (408), and address FIFO (412) are controlled by the memory controller (499) to allow the latent data to be synchronized with the address according to the read/write latency of the various flavors of SDRAM. In some examples, the physical size of the read FIFO (410) and write FIFO (408) may be substantial given the large number of data pins supported by the memory controller (499).

Figure 6:
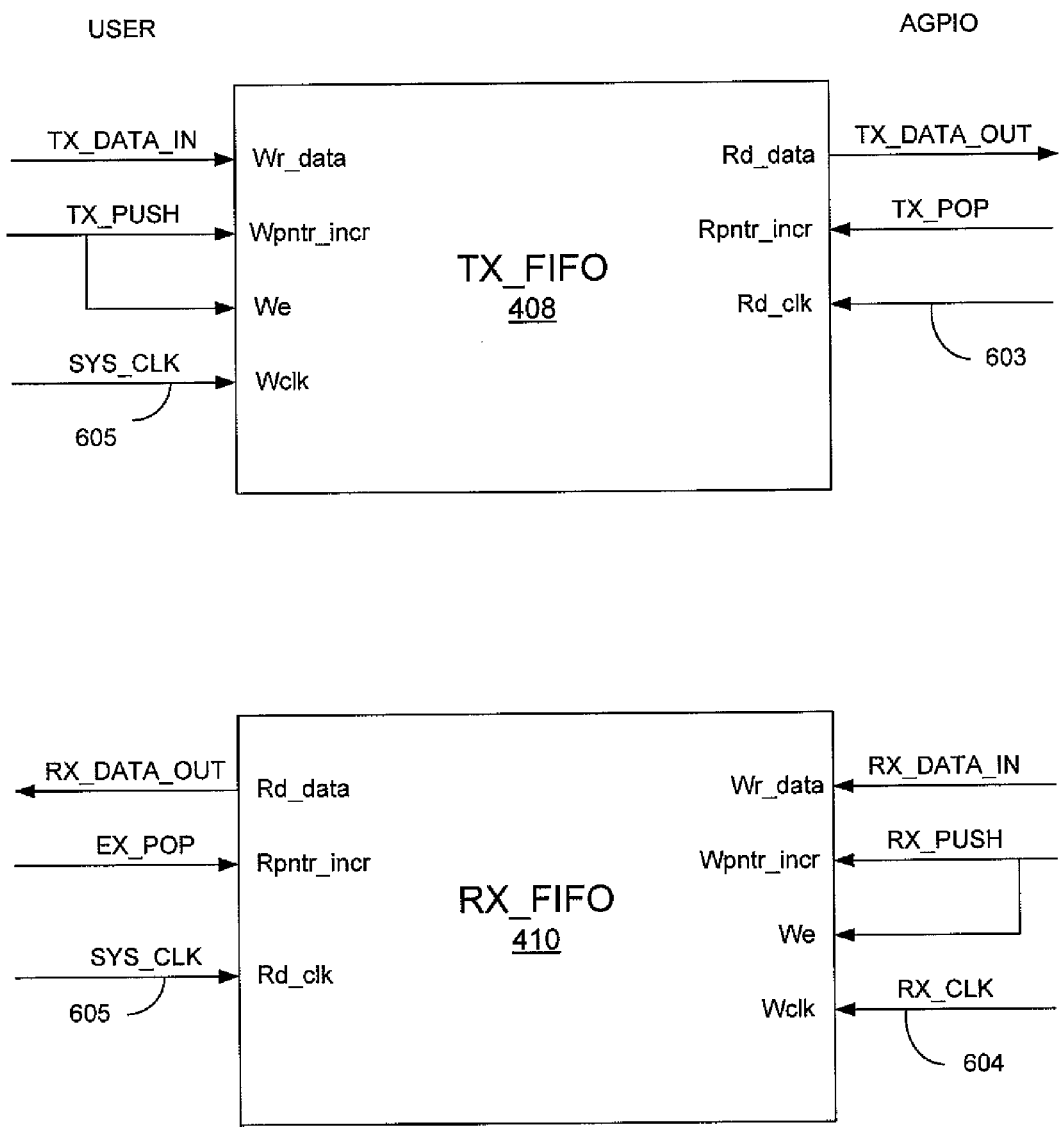
FIG. 6 shows Write/Read FIFO operations in accordance with one or more embodiments of the invention.

FIG. 6 shows basic operations of the write FIFO (408) (TX_FIFO) and the read FIFO (410) (RX_FIFO) in accordance with an embodiment of the present invention. In an example of a write operation, the write FIFO (408) supplies data to be written to the external memory devices using clock signal (603). The write latency of the external memory devices determines the rate the data in the write FIFO (408) are consumed. Accordingly, the user logic (402) checks TX_FIFO_EMPTY, TX_FIFO_FULL, and TX_FIFO_AL-MOST_FULL flags to determine if the write FIFO (408) is ready to accept additional data. If TX_FIFO_FULL is asserted, there is no room in the write FIFO (408) to accept additional data. If TX_FIFO_ALMOST_FULL or TX_FI-FO_EMPTY is asserted, the write FIFO (408) can accept additional data such as one or more programmed burst length of data. The write FIFO (408) receives data using the clock (605). The corresponding write address can be loaded into the address FIFO at an appropriate clock cycle relative to the write FIFO (408) accepting the additional data according to the write latency of the external memory devices. Data may be loaded into the write FIFO (408) using TX_PUSH command for the programmed burst length. Data is presented to the write FIFO (408) on TX_DATA_IN. The memory controller monitors the TX_PUSH signal to manage the PUSH pointer for the TX_FIFO internally. Depending on the content of the write FIFO (408), TX_FIFO_EMPTY, TX_FIFO_FULL, or TX_FIFO_ALMOST_FULL may be flagged. The user logic (402) also monitors the AF_FIFO_EMPTY, AF_FIFO_FULL, and AF_FIFO_ALMOST_FULL flags and loads the write address into the address FIFO (412). The memory controller (499) monitors the AF_VALID signal to manage the PUSH pointer for the address FIFO (412) internally, and may flag AF_FIFO_EMPTY, AF_FIFO_FULL, or AF_FIFO_ALMOST_FULL. The memory controller (499) will place the requested address on the memory address bus with the appropriate command signals for a WRITE operation. The memory controller (499) also ensures that the clock signal 508 (TS_ENABLE) is set to the correct value. The memory controller (499) asserts TX_POP signal for the duration of the burst. This action moves the data out of the write FIFO (408) onto the external memory interface data pins 505. The memory controller (499) manages the POP pointer and maintains internal status of the write FIFO (408) full/empty states. The memory controller (499) will determine whether a bank has to be precharged, activated early, etc., to ensure that the dead cycles on the data bus are minimal. If the current transaction is the last command in the address FIFO and the user has asserted PRECHARGE, the memory controller (499) will issue a write with auto precharge for this transaction.

The READ operation is similar to the WRITE operation except that roles of the PUSH and POP signals are reversed from the perspective of the controller and the user. In an example of a read operation, the read FIFO (410) receives data read from the external memory devices using clock signal (604). The exact sequencing of these operations and their timing may be different in different embodiments.

Referring back to FIG. 4, upon power-on, the memory controller (499) is held in reset and performs no operations. During initialization, memory-specific parameters such as the values for the various counters (e.g., the time delay between a row access strobe and a column access strobe represented as $t_{RCD}$), address width, data width, etc., are written into the configuration registers (415) internal to the memory controller (499) through a REG_ADDR/WR_DATA interface implemented with mode register data bus (414). This may be accomplished through user logic (402) external to the memory controller (499). After these initial configurations, the memory controller (499) may be further initialized. For example, the user logic (402) may assert START_INIT and cause the memory controller (499) to perform the initialization sequence. The memory controller (499) asserts INIT_DONE upon the completion of the initialization sequence. Alternatively, the user logic (402) may perform the initialization sequence by asserting the BYPASS (e.g., BYPASS=1) and cause the memory controller (499) to be in the BYPASS mode. After the initialization, the user logic (402) may de-assert the BYPASS and cause the memory controller (499) to take over command and control operations. Training sequences may also be implemented through user logic (402), in order to calibrate one or more memory strobes relative to data. The calibration is done before commencing regular transactions. In some embodiments of the present invention, the signals are valid on the rising edge of the SYS_CLK.

The memory controller (499) may operate in different modes, including but not limited to BYPASS, PRECHARGE, AUTO_REFRESH, POWER_DOWN, REFRESH, NOP, ACTIVATE, READ, WRITE, DESELECT, and LD_MODE. For example, in the BYPASS mode, the user logic (402) can issue commands directly to the external memory devices bypassing the memory controller (499) and the associated state machines. In the BYPASS mode, bits [51:45] of the AF_DATA[58:0] may take on the roles of RAS#, CAS#, CKE[3:0], WE#/W# and other signals to drive the physical interface with the external memory devices. Specifically, addresses to the external memory devices are controlled through bits [31:12] of the AF_DATA[58:0]. The user logic (402) may control the RX_PUSH and TX_POP signals, through bits 56 and 57, respectively of the AF_DATA[58:0]. Bit 45 signals a "read" operation if it is set to "0," and a "write" operation if it is set to "1." When BYPASS=1, the bits of the AF_DATA[58:0] are listed in the following Table 2.

TABLE 2

| List of bits when BYPASS = 1. | | | | | | | | |
|---|---|---|---|---|---|---|---|---|
| 58 | 57 | 56 | 55-52 | 51 | 50 | 49-46 | 45 | 44-41 |
| TX_DQS_ENABLE | TX_POP | RX_PUSH | ODT0[3:0] | RAS | CAS | CKE[3:0] | WE | CS[3:0] |

In normal operations, before the memory controller (499) accesses data through read or write commands to a memory bank, a row in that bank needs to be opened. After a memory bank is opened (e.g., activated), it should be closed with a "precharge" command before a different row in the same bank can be opened. In the PRECHARGE mode, in normal operations, the memory controller (499) will look at the previous, the current, and the next addresses to determine whether the bank and row need to be precharged or they should be left open. When the PRECHARGE signal is enabled, the memory controller (499) uses this information, in situations where the FIFO is either EMPTY or contains the last transaction, to issue a precharge. If this signal is disabled, the memory controller (499) leaves the bank and row open for subsequent accesses. When the AUTO_REFRESH mode is set in the memory controller configuration registers (415), the memory controller (499) automatically issues refreshes to the external memory on a fixed period, depending on the settings in memory controller configuration registers (415). When the POWER_DOWN bit is set to 1, the memory controller (499) may manage power of an external memory device automatically. A scenario to manage the power in accordance with some embodiments of the present invention is described as follows. In an exemplary configuration, a memory interface may have a total of four ranks including two 2-Rank DIMMs sitting in two slots. A counter for each of the four ranks will count up to a predetermined value set in a delay register. Another bit in the memory controller configuration registers (415) enables or disables power management. The counters start counting whenever the user sets this bit. If there are no accesses to a given rank and the counter times out, the CKE for that rank is pulled low (power down). If there is an access to the rank before the counter times out, the counter is reset and the cycle continues. When the REFRESH bit is set to 1, the memory controller (499) issues a refresh to the external memory immediately after completing the current transaction.

The LD_MODE allows the user to update the mode register settings in the memory controller configuration registers (415). When enabled, the memory controller (499) completes the current set of transactions and loads the mode register settings into the external memory. The MRS_DONE signal is asserted when the controller completes the load. A dedicated interface may be provided to the user to write or read the information in the memory controller configuration registers (415). The configuration registers (415) will hold information regarding the mode register settings, including various timing parameters such as ACTIVATE TO READ/WRITE delay, etc. The configuration registers (415) will contain default settings at configuration. The user can override the default settings by writing to registers using REG_ADDR, REG_WDATA, and REG_WE signals. Data from these registers may also be read back using these interfaces. Some operation modes such as AUTO_REFRESH may optionally be treated as a register setting instead of a user input from a separate pin.

The register map for the memory controller is shown in the following Table 3.

TABLE 3

Register map for an exemplary memory controller.

| Location | Comments |
|---|---|
| 0, 1, 2 | DDR/RLDRAM MRS |
| 3, 4, 5 | DDR EMRS1 |
| 6, 7, 8 | DDR EMRS2 |
| 9, 10, 11 | DDR EMRS3 |
| 12<4:0> | CONFIG - Memory type (see below table) |
| 13<4:0> | CONFIG - Address width |
| 14<6:0> | CONFIG - Data Width |
| 15<2:0> | QDR Burst Length configuration. |
| 16 | Data Path Delay configuration (tx 1:0, rx 5:4) |
| 17<1:0> | Ts_en path delay configuration |
| 18<4:0> | Sdr to ddr clock phase select - 32 taps |
| 19<4:0> | Ddr to sdr clock phase select - 32 taps |
| 20 | Read/Write Data FIFO threshold configuration tx<3:0>, rx<7:4> |
| 21 | RLD2 mrs configuration |
| 22 | <7:5> row config, <4:2> column config, <1:0> bank config |
| 23 | DDR Refresh done LSB count (sm_sel = 1) - during initialization |
| 24 | DDR Refresh done LSB count (sm_sel = 2) - during initialization |
| 25 | DDR Refresh done MSB count (sm_sel = 1) - during initialization |
| 26 | DDR Refresh done MSB count (sm_sel = 2) - during initialization |
| 27 | RLD Refresh done LSB count (sm_sel = 3) - during initialization |
| 28 | RLD Refresh done LSB count (sm_sel = 0) - during initialization |
| 29 | RLD Refresh done MSB count (sm_sel = 0) - during initialization |
| 30 | RLD Refresh done LSB count (sm_sel = 1.2) - during initialization |
| 31 | RLD Refresh done MSB count (sm_sel = 1.2) - during initialization |
| 32<3:0> | DDR cntr 0 done value |
| 33<3:0> | DDR cntr 1 done value |
| 34<3:0> | DDR cntr 2 done value |
| 35<3:0> | DDR cntr 3 done value |
| 36<3:0> | DDR cntr 4 done value |
| 37<3:0> | DDR cntr 5 done value |
| 38<3:0> | DDR cntr 6 done value |
| 39<3:0> | DDR cntr 7 done value |
| 40<3:0> | DDR cntr 8 done value |
| 41<3:0> | DDR cntr 9 done value |
| 42<3:0> | DDR cntr 10 done value |
| 43<4:0> | DDR cntr 11 done value |
| 44<5:0> | DDR cntr 12 done value |
| 45<5:0> | DDR cntr 13 done value |
| 46 | DDR Refresh done = LSB count (sm_sel = 0) - during/after initialization |
| 47 | DDR Refresh done = MSB count (sm_sel = 0) - during/after initialization |
| 48<3:0> | RLD cntr 0 done value |
| 49<3:0> | RLD cntr 1 done value (Bank 0 counter) |
| 50<3:0> | RLD cntr 2 done value (Bank 1 counter) |
| 51<3:0> | RLD cntr 3 done value (Bank 2 counter) |
| 52<3:0> | RLD cntr 4 done value (Bank 3 counter) |
| 53<3:0> | RLD cntr 5 done value (Bank 4 counter) |
| 54<3:0> | RLD cntr 6 done value (Bank 5 counter) |
| 55<3:0> | RLD cntr 7 done value (Bank 6 counter) |
| 56<3:0> | RLD cntr 8 done value (Bank 7 counter) |
| 57<3:0> | RLD cntr 9 done value (Write latency counter) |
| 58<3:0> | RLD cntr 10 done value |
| 59<4:0> | RLD cntr 11 done value |
| 60<5:0> | RLD cntr 12 done value |
| 61<5:0> | RLD cntr 13 done value |
| 62 | RLD Refresh done LSB count after initialization |
| 63 | RLD Refresh done MSB count after initialization |

| Memory Type | |
|---|---|
| MT_DDR | 5'b0_0001 |
| MT_DDR2 | 5'b0_0010 |
| MT_DDR3 | 5'b0_0011 |
| MT_DDR_UD | 5'b0_0100 |
| MT_DDR_RD | 5'b0_0101 |
| MT_DDR2_UD | 5'b0_0110 |
| MT_DDR2_RD | 5'b0_0111 |
| MT_RLD1_X32 | 5'b0_1000 |
| MT_RLD1_X16 | 5'b0_1001 |
| MT_RLD_II | 5'b0_1010 |
| MT_RLD_II_SIO | 5'b0_1011 |
| MT_QDR_DDR_X18 | 5'b0_1100 |
| MT_QDR_DDR_X36 | 5'b0_1101 |
| MT_QDR_DDR_X8 | 5'b0_1110 |
| MT_QDR_DDR_X9 | 5'b0_1111 |
| MT_QDR2_X18 | 5'b1_0000 |
| MT_QDR2_X36 | 5'b1_0001 |
| MT_QDR2_X8 | 5'b1_0010 |
| MT_QDR2_X9 | 5'b1_0011 |
| MT_QDR_X18 | 5'b1_0100 |
| MT_QDR_X36 | 5'b1_0101 |

| ADDR | | | | | | | | DATA | | | | | | | |
|---|---|---|---|---|---|---|---|---|---|---|---|---|---|---|---|
| 7 | 6 | 5 | 4 | 3 | 2 | 1 | 0 | 7 | 6 | 5 | 4 | 3 | 2 | 1 | 0 |
| 0x01 | | | | | | | | Mode Register 0 | | | | | | | |
| 0x02 | | | | | | | | Mode Register 0 | | | | | | | |
| 0x03 | | | | | | | | Mode Register 0 | | | | | | | |
| 0x04 | | | | | | | | Mode Register 1 | | | | | | | |
| 0x05 | | | | | | | | Mode Register 1 | | | | | | | |
| 0x06 | | | | | | | | Mode Register 1 | | | | | | | |
| 0x07 | | | | | | | | Mode Register 2 | | | | | | | |
| 0x08 | | | | | | | | Mode Register 2 | | | | | | | |
| 0x09 | | | | | | | | Mode Register 2 | | | | | | | |
| 0x0A | | | | | | | | Mode Register 3 | | | | | | | |
| 0x0B | | | | | | | | Mode Register 3 | | | | | | | |
| 0x0C | | | | | | | | Mode Register 3 | | | | | | | |

Figure 7:
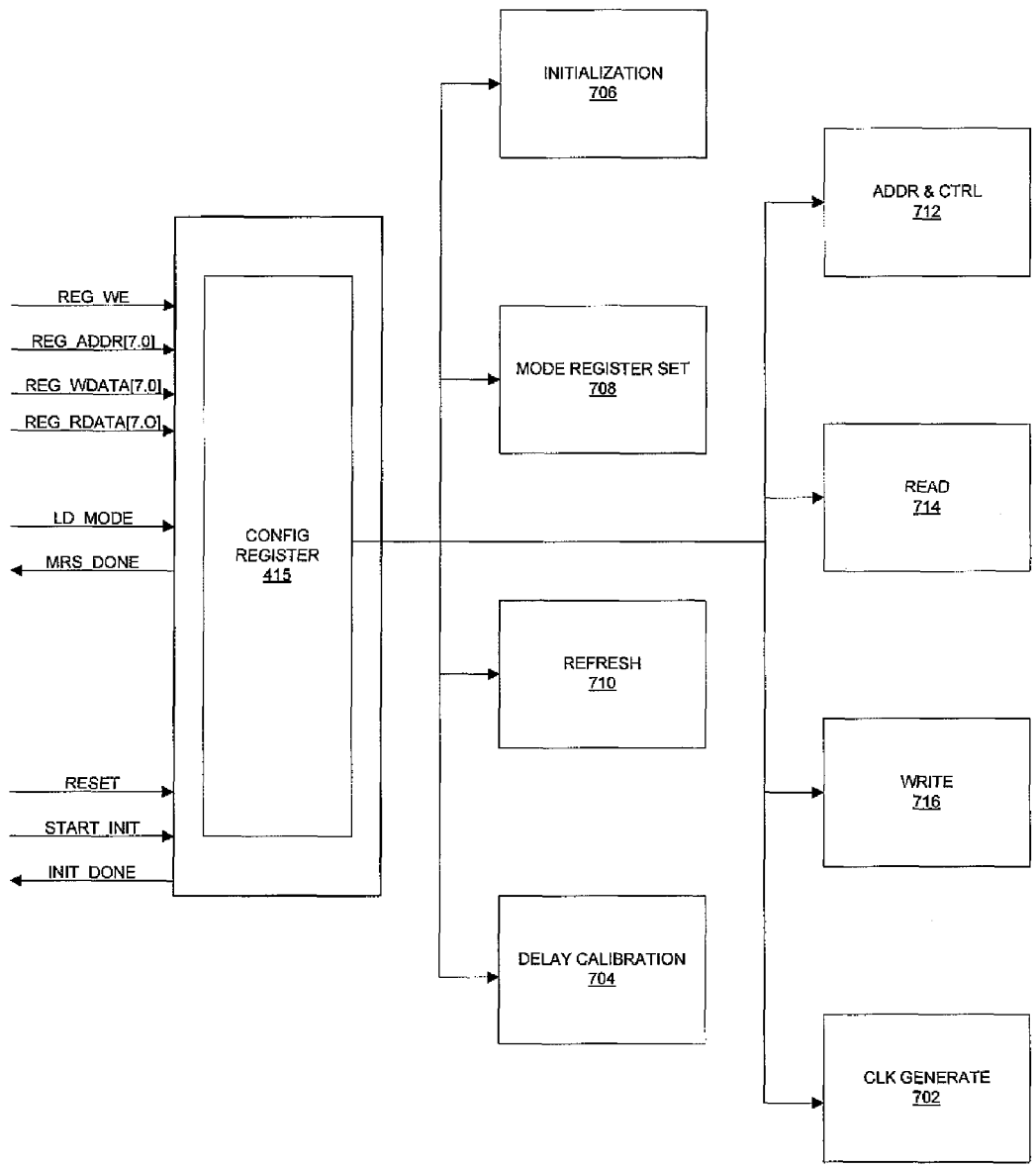
FIG. 7 shows configuration register and configuration bit interactions with the state machine in accordance with one or more embodiments of the invention.

Referring to FIG. 7, information in the configuration register (415) may be used by the state machines (such as initialization (706), mode register set (708), refresh (710), add & control (712), read (714), and write (716)). For example, the state machine refresh (710) may use the memory type settings to determine the required refresh rate for the external memory devices. In an example, configuration register (415), initialization (706), mode register set (708), refresh (710), add & control (712), read (714), and write (716) are preferably implemented using hard macros. The delay calibration (704) and clock generation (702) may be implemented as soft macros. Exemplary burst definitions with burst lengths of 4 and 8 are listed in the following Table 4.

TABLE 4

Burst definition.

| Burst Length | Starting Column Address (A2, A1, A0) | Order of Accesses Within a Burst | |
|---|---|---|---|
| | | Burst Type = Sequential | Burst Type = Interleaved |
| 4 | 0 0 | 0, 1, 2, 3 | 0, 1, 2, 3 |
| | 0 1 | 1, 2, 3, 0 | 1, 0, 3, 2 |
| | 1 0 | 2, 3, 0, 1 | 2, 3, 0, 1 |
| | 1 1 | 3, 0, 1, 2 | 3, 2, 1, 0 |
| 8 | 0 0 0 | 0, 1, 2, 3, 4, 5, 6, 7 | 0, 1, 2, 3, 4, 5, 6, 7 |
| | 0 0 1 | 1, 2, 3, 0, 5, 6, 7, 4 | 1, 0, 3, 2, 5, 4, 7, 6 |
| | 0 1 0 | 2, 3, 0, 1, 6, 7, 4, 5 | 2, 3, 0, 1, 6, 7, 4, 5 |
| | 0 1 1 | 3, 0, 1, 2, 7, 4, 5, 6 | 3, 2, 1, 0, 7, 6, 5, 4 |
| | 1 0 0 | 4, 5, 6, 7, 0, 1, 2, 3 | 4, 5, 6, 7, 0, 1, 2, 3 |
| | 1 0 1 | 5, 6, 7, 4, 1, 2, 3, 0 | 5, 4, 7, 6, 1, 0, 3, 2 |
| | 1 1 0 | 6, 7, 4, 5, 2, 3, 0, 1 | 6, 7, 4, 5, 2, 3, 0, 1 |
| | 1 1 1 | 7, 4, 5, 6, 3, 0, 1, 2 | 7, 6, 5, 4, 3, 2, 1, 0 |

Examples of address mapping schemes include RA:BA:ROW:COL and ROW:RA:BA:COL. A length field may be additionally included to indicate how many bursts are to be accessed from the external memory. A burst length may be programmed by the user and specified in the length field. The memory controller (499) breaks up the access into multiple DDR bursts based on the programmed burst length, bus width, and start address alignment. Adding the access length field to the Address FIFO allows for more efficient use of the FIFO. It also allows the memory controller (499) to access the next entry in the FIFO and start this access as soon as possible, thereby facilitating overlapping of commands.

Memory command overlapping increases memory efficiency, and allows delays for transactions such as active to read/write ($t_{RCD}$) and read/write precharge ($t_{RPD}$) to be hidden for subsequent sequential access to memory. A second bank or command register is added to pop the next entry in the Address FIFO. Comparison logic will be necessary to decide whether this next command will access the same bank, the same page, or a new bank, etc. When a command is written into the Address FIFO it will be read by the memory controller (499) as soon as possible. The memory controller (499) will activate the bank associated with this command's address. If there is a second entry in the Address FIFO, it is read from the FIFO immediately after the first. If the second command's address is in another bank, that bank will be activated as soon as allowed by the DDR memory and as soon as there is an available slot on the memory bus (the DDR command bus is idle). If the first command's access to memory is longer than the time it takes to activate the second command's bank ($t_{RCD}$), access to the second command's data can start immediately upon completing the first command's access, thereby hiding the entire activation of the second bank. After a command has completed accessing memory, the decision to precharge will be based on the next command. If the next command is in the same page, precharge will not be necessary. If the next command requires a new bank, the previous bank will be precharged and the new bank activated. The goal is for the precharge and new bank activation to be completed while data is being transferred for the most current operation.

The memory controller in accordance with a embodiment of the present invention expects aligned addresses, and unaligned addresses are handled through logic external to the memory controller. Consider an example of a 64-bit DDR memory configured for a burst length of 4, length field is set to 1 burst. If a user requests a read at address x000, the memory controller issues a single read, and the memory returns 4×8 Byte of data. Each 8 Byte data chunk is read from the DDR internal memory locations 0, 1, 2, and 3 in that order. On a subsequent read, the next aligned address the user should use is x004, which is an integer multiplication of the burst length. Consider an example of a non-aligned address, address=x002. If the controller issues a read to this address, the memory will return 4×8 Bytes of data from the internal locations 2, 3, 0, 1 in that order. If there are no more entries in the FIFO, the memory controller does not issue RX_PUSH to the DGPIO. In the write case, the controller issues an interrupting command when applicable to prevent wasted cycles of writing masked data. If interrupting a write command, the memory controller will mask the extra write cycles.

Read modify write (RMW) cycles are needed when an agent writes a partial word to memory and when ECC is turned on. A wrapper may be used in the case that the memory controller does not support RMW. Thus, the need for an RMW cycle must be calculated before the command is put into the Address FIFO. If an RMW cycle is needed, the wrapper will break the original write command into an individual read and a write. Once the read is issued, no other command is put into the Address FIFO until the read data is returned, the original write data and read data are mixed, new ECC is calculated and the data/ECC are written back to memory.

The memory controller (499) in accordance with some embodiments of the present invention is adapted to manage power consumption in external memories. Power management is enabled or disabled using one bit in the memory controller configuration registers (415). For example, consider a case with a memory interface having two 2-Rank DIMMs sitting in two slots, and thus the interface has four ranks in total. A programmable delay is provided for each rank. A counter for each rank starts counting up to a value set in the delay register whenever the user enables the power management. If there are no accesses to a rank and the corresponding counter times out, the rank is powered down by pulling low a CKE. If there is an access to the rank before the counter times out, the counter resets and the cycle continues.

A number of soft cores may be provided to supplement the functionalities of the memory controller (499), such as training pattern generator, DQS preamble and post amble generator, read external ROM and load register map, RMW logic, user FIFO logic for clock domain conversion, non-aligned to aligned address mapping, etc.

Figure 8:
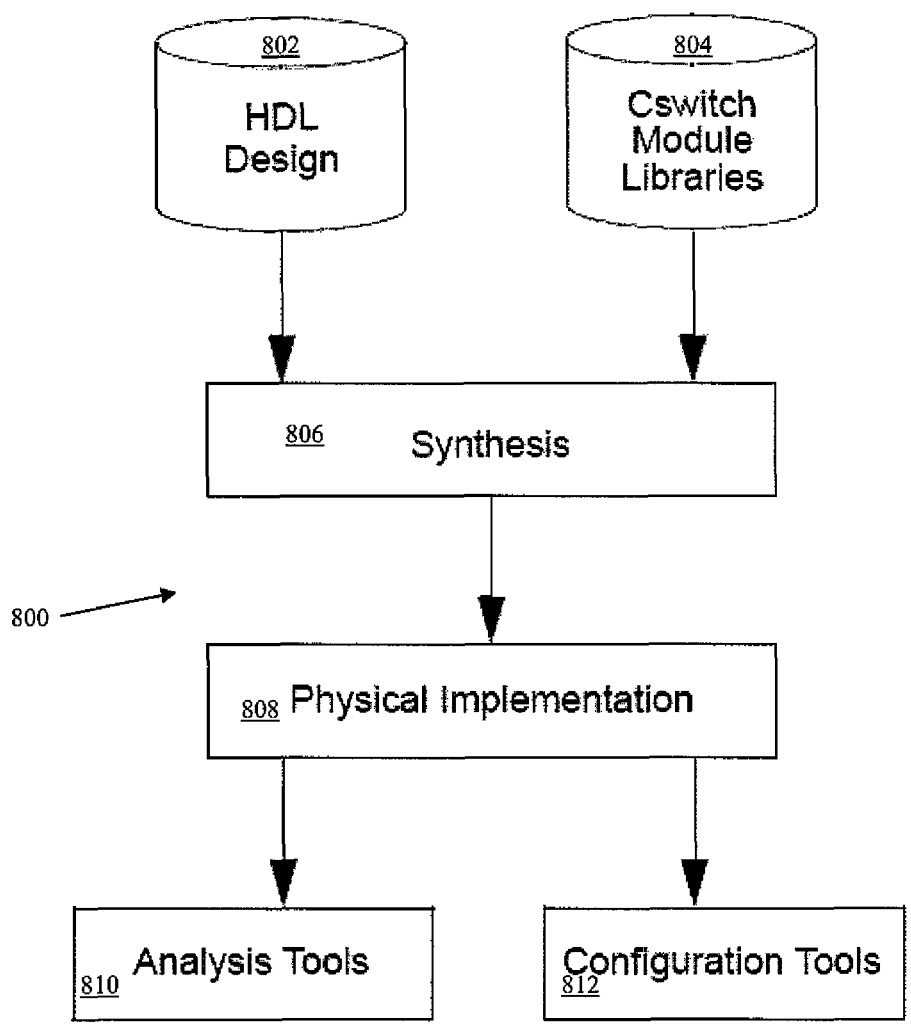
FIG. 8 shows an exemplary design and programming system for the heterogeneous configurable integrated circuit in accordance with one or more embodiments of the invention.

FIG. 8 shows an exemplary design and programming system for the heterogeneous configurable integrated circuit (200). Here, system (800) includes HDL design (802), Module Libraries (804), Synthesis Tools (806), Physical Implementation Tools (808), Analysis Tools (810), and Configuration Tools (812). A design may be entered in hardware description language (HDL) in the form of an HDL design (802). The HDL may include: Verilog, VHDL, System Verilog, or any combination there of. Module Libraries (804) may include a number of models representing special-purpose blocks, such as a model for the memory controller (499). The HDL design (802) may infer, or include by reference, the memory controller model or other models from the Module Libraries (804) according to the functions required by the design. The Synthesis Tools (806) may map the design to be composed of PLB functionalities and the memory controller model or other models corresponding to the design functions. The Physical Implementation Tools (808) may perform placement of the PLB functionalities and the memory controller model or other models onto the PLB fabric and the corresponding special-purpose blocks. The Physical Implementation Tools (808) may further perform routing of the PLB fabric and the memory controller or other special-purpose blocks to complete the implementation of the design. The Analysis Tools (810) may analyze timing delays and interconnection latency of the design implementation. The Configuration Tools (812) may prepare configuration information and perform the configuration of the heterogeneous configurable integrated circuit (200) according to the completed design implementation. In embodiments of the invention, the memory controller model from the Module Libraries (804) may include information relating to signal nodes, such as AF DATA, or the like) suitable for connecting using the high speed communications fabric of the heterogeneous configurable integrated circuit (200). This information may be utilized by the Physical Implementation Tools (808) to perform routing using the interconnect stations (202) of the reconfigurable high speed communications fabric. The memory controller model from the Module Libraries (804) may also include information relating to certain circuit requirement, (such as multiple signals requiring matched interconnect latency) to accommodate the latency associated with the pipelined buses (503). This information may be utilized by the Synthesis Tools (806) to perform the design mapping according to the circuit requirement. The Analysis Tools (810) may provide information relating to delay timing violation or interconnection latency violation of the completed design implementation with respect to design requirement. This information may be utilized by the Synthesis Tools (806) and the Physical Implementation Tools (808) to fine tune the design mapping and placement routing in a design iteration. For example, the design mapping and placement routing may be fine tuned as shown in the descriptions relating to FIGS. 3A and 3B. Further, the Analysis Tools (810) may provide information relating to estimated interconnection clock frequency and latency prior to the Synthesis Tools (806) performing design mapping or the Physical Implementation Tools (808) performing placement routing. This information may be utilized by the Synthesis Tools (806) or the Physical Implementation Tools (808) to execute timing driven or latency driven algorithms for optimizing the design implementation with reduced design iterations.

Applications of the memory controller for the heterogeneous configurable integrated circuit in accordance with embodiments of the present invention include, but are not limited to, network and storage switching/routing, broadband aggregation, security and content inspection, optical transport, telecom, wireless base station, NPU offload packet acceleration, and layer 4-7 applications.

Advantages of one or more embodiments of the present invention may include, but are not limited to: separate data and control paths allow the capability of re-allocating resources; improved system performance and lower power consumption; distributed data bits and command overlapping; capable of assigning pins thus increasing system flexibility.

Advantages of one or more embodiments of the present invention include a memory controller that can be reconfigured for use with a large variety of external memory technologies, and their corresponding burst sizes, read-write latencies, bus widths, bank sizes, and clock frequencies. Further, the memory controller may be reconfigured with minimal change to the rest of the system.

While the invention has been described with respect to a limited number of embodiments, those skilled in the art, having benefit of this disclosure, will appreciate that other embodiments can be advised which do not depart from the scope of the invention as disclosed herein. Accordingly, the scope of the invention should be limited only by the attached claims.

What is claimed is:

1. A system comprising:
a configurable memory controller including a plurality of configuration bits configured to indicate at least one of memory type, address, data width, and operating frequency;
wherein the configurable memory controller comprise a configuration registers to store the plurality of the configuration bits and a mode register bits;
a dedicated interface coupled to the configuration registers by a mode register data bus, wherein the dedicated interface is used by the user for setting the values in the configuration registers;
a memory interface; and
a configurable high speed communications fabric comprising a plurality of interconnect stations arranged in an array wherein each of the plurality of interconnect stations includes a first set of connectors and a second set of connectors wherein the first set of connectors is configured to couple to an adjacent interconnect station via a plurality of pipelined buses,
wherein the configurable memory controller is operably coupled to the configurable high speed communications fabric using a first interconnect station of the plurality of interconnect stations,
wherein the memory interface is operably coupled to the configurable high speed communications fabric using a second interconnect station of the plurality of interconnect stations,
wherein the second set of connectors is configured to connect to a programmable logic block ("PLB").

2. The system of claim 1, wherein the memory interface comprises a configurable general purpose input/output (GPIO) block operably coupled to the configurable memory controller using the first and the second interconnect stations of the plurality of interconnect stations.

3. The system of claim 2, wherein the configurable memory controller and the configurable GPIO block are operable to cooperatively execute a first data transaction with a memory device connected to the memory interface.

4. The system of claim 3, wherein the configurable memory controller comprises an address first-in first-out (FIFO) device and is operable to perform an address function and a control function associated with the first data transaction.

5. The system of claim 4, wherein the configurable memory controller is operable in at least one mode selected from a group consisting of: BYPASS, PRECHARGE, AUTO_REFRESH, POWER_DOWN, REFRESH, NOP, ACTIVATE, READ, WRITE, DESELECT, and LD_MODE.

6. The system of claim 3, wherein the configurable GPIO block comprises a read data FIFO device and a write data FIFO device and is operable to perform a data path function associate with the first data transaction.

7. The system of claim 2, wherein the configurable integrated circuit is disposed on a monolithic semiconductor substrate, wherein the memory device is external to the monolithic semiconductor substrate, and wherein the configurable GPIO block borders the monolithic semiconductor substrate.

8. The configurable integrated circuit of claim 7, wherein the configurable memory controller sends a command to power down at least a portion of the memory device subsequent to a counter counting to a predetermined count and there is no pending access to the portion of the memory device.

9. The system of claim 1, wherein the configurable memory controller comprises a datapath that is decoupled from at least one selected from a group consisting of an address path and a control path.

10. The system of claim 1, wherein the configurable memory controller supports double data rate (DDR), reduced latency dynamic random access memory (RL DRAM), and quad data rate synchronous dynamic random access memory (QDR SDRAM).

11. A programmable logic system comprising:
a configurable memory controller having a configuration register capable of providing memory configuration;
wherein the configuration register includes a plurality of mode register bits, and a plurality of configuration bits, wherein the plurality of configuration bits are programmable to indicate memory type, memory address, data width, and operating frequency;
a dedicated interface coupled to the configuration registers by a mode register data bus, wherein the dedicated interface is used by the user for setting the values in the configuration registers;
a memory interface coupled to the configurable memory controller and configured to include a configurable general purpose input/output (GPIO) block coupled to the configurable memory controller using the first and the second interconnect stations of the plurality of interconnect stations; and
a configurable high speed communications fabric coupled to the configurable memory controller and including a plurality of interconnect stations arranged in an array wherein each of the plurality of interconnect stations includes a set of ports and a set of ramps wherein the set of ramps is configured to couple to an adjacent interconnect station via a plurality of pipelined buses, wherein the configurable memory controller, the memory interface, and the configurable high speed communications fabric are associated with a configurable integrated circuit.

12. The system of claim 11, wherein the memory interface is operably coupled to the configurable high speed communications fabric using a second interconnect station of the plurality of interconnect stations.

13. The system of claim 11, wherein the plurality of interconnect stations are configured to satisfy a timing requirement of the memory interface.

14. The system of claim 11, wherein the configurable memory controller and the configurable GPIO block are operable to cooperatively execute a first data transaction with a memory device connected to the memory interface.

15. The system of claim 14, wherein the configurable memory controller comprises an address first-in first-out (FIFO) device and is operable to perform an address function and a control function associated with the first data transaction.

16. The system of claim 11, wherein the configurable GPIO block comprises a read data FIFO device and a write data FIFO device and is operable to perform a data path function associate with the first data transaction.

17. The system of claim 11, wherein the configurable memory controller comprises a data path that is decoupled from at least one selected from a group consisting of an address path and a control path.

18. The system of claim 11, wherein the configurable memory controller is operable in a mode selected from one of BYPASS mode, PRECHARGE mode, AUTO_REFRESH mode, POWER_DOWN mode, REFRESH mode, NOP mode, ACTIVATE, READ mode, WRITE, DESELECT mode, and LD_MODE mode.

19. The system of claim 11, wherein the configurable memory controller supports double data rate (DDR), reduced latency dynamic random access memory (RL DRAM), and quad data rate synchronous dynamic random access memory (QDR SDRAM).

* * * * *